(12) United States Patent
Gendron-Hansen et al.

(10) Patent No.: US 10,566,416 B2
(45) Date of Patent: Feb. 18, 2020

(54) SEMICONDUCTOR DEVICE WITH IMPROVED FIELD LAYER

(71) Applicant: Microsemi Corporation, Aliso Viejo, CA (US)

(72) Inventors: Amaury Gendron-Hansen, Bend, OR (US); Bruce Odekirk, Bend, OR (US); Nathaniel Berliner, Bend, OR (US); Dumitru Sdrulla, Bend, OR (US)

(73) Assignee: Microsemi Corporation, Chandler, AZ (US)

( * ) Notice: Subject to any disclaimer, the term of this patent is extended or adjusted under 35 U.S.C. 154(b) by 0 days.

(21) Appl. No.: 16/103,949

(22) Filed: Aug. 15, 2018

(65) Prior Publication Data

US 2019/0058032 A1 Feb. 21, 2019

Related U.S. Application Data

(60) Provisional application No. 62/547,901, filed on Aug. 21, 2017.

(51) Int. Cl.

| | |
|---|---|
| *H01L 29/06* | (2006.01) |
| *H01L 29/16* | (2006.01) |
| *H01L 29/872* | (2006.01) |
| *H01L 29/66* | (2006.01) |
| *H01L 21/02* | (2006.01) |
| *H01L 21/265* | (2006.01) |
| *H01L 21/324* | (2006.01) |
| *H01L 29/45* | (2006.01) |
| *H01L 21/04* | (2006.01) |
| *H01L 29/861* | (2006.01) |
| *H01L 29/20* | (2006.01) |

(52) U.S. Cl.
CPC ...... *H01L 29/0603* (2013.01); *H01L 21/0214* (2013.01); *H01L 21/02211* (2013.01); *H01L 21/02274* (2013.01); *H01L 21/046* (2013.01); *H01L 21/0495* (2013.01); *H01L 21/26513* (2013.01); *H01L 21/324* (2013.01); *H01L 29/0619* (2013.01); *H01L 29/1608* (2013.01); *H01L 29/45* (2013.01); *H01L 29/6606* (2013.01); *H01L 29/66128* (2013.01); *H01L 29/66136* (2013.01); *H01L 29/8611* (2013.01); *H01L 29/872* (2013.01); *H01L 29/20* (2013.01)

(58) Field of Classification Search
CPC . H01L 29/0603; H01L 29/1608; H01L 29/45; H01L 29/6606; H01L 29/66136; H01L 29/872; H01L 21/0214; H01L 21/02211; H01L 21/02274; H01L 21/046; H01L 21/0495; H01L 21/26513; H01L 21/324
USPC .................................................... 257/649
See application file for complete search history.

(56) References Cited

U.S. PATENT DOCUMENTS

| | | |
|---|---|---|
| 5,674,788 A | 10/1997 | Wristers et al. |
| 6,930,060 B2 | 8/2005 | Chou et al. |
| 6,936,905 B2 | 8/2005 | Wu |

(Continued)

*Primary Examiner* — Tu-Tu V Ho
(74) *Attorney, Agent, or Firm* — Glass and Associates; Kenneth Glass

(57) ABSTRACT

A semiconductor device constituted of: a semiconductor layer; and a field layer patterned on said semiconductor layer, said field layer constituted of material having characteristics which block diffusion of mobile ions and maintain structural integrity at activation temperatures of up to 1200 degrees centigrade.

23 Claims, 6 Drawing Sheets

(56) References Cited

U.S. PATENT DOCUMENTS

| | | |
|---|---|---|
| 7,671,410 B2 | 3/2010 | Zhao et al. |
| 8,110,888 B2 | 2/2012 | Zhang et al. |
| 2002/0130371 A1* | 9/2002 | Bryant ................. B41J 2/14016 257/379 |

* cited by examiner

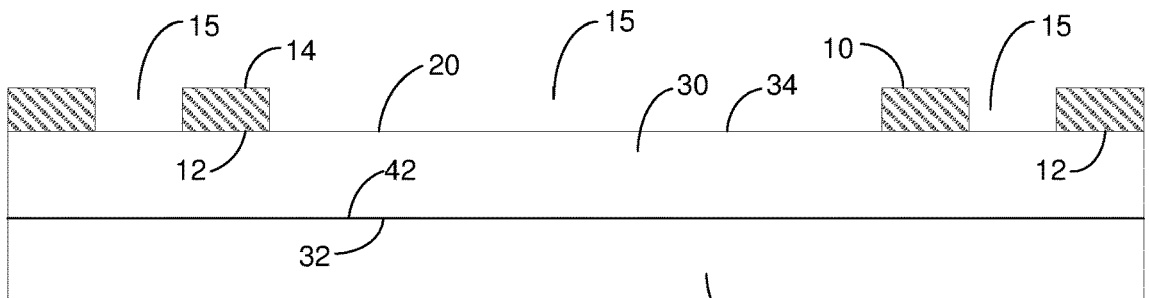
FIG. 1A  *PRIOR ART*
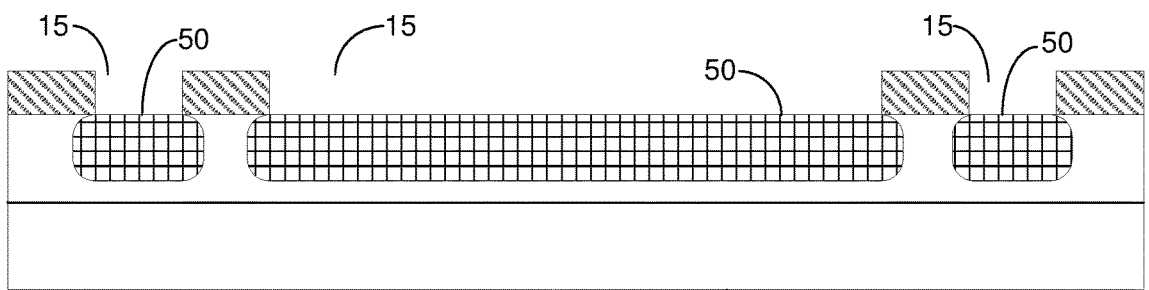
FIG. 1B  *PRIOR ART*
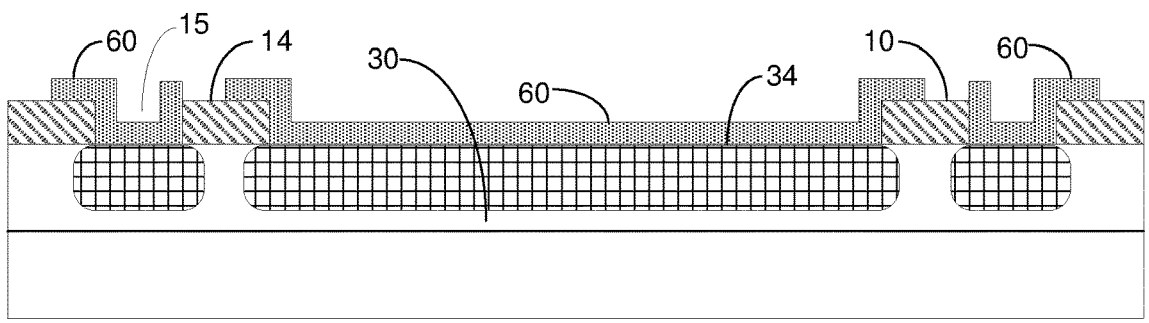
FIG. 1C  *PRIOR ART*
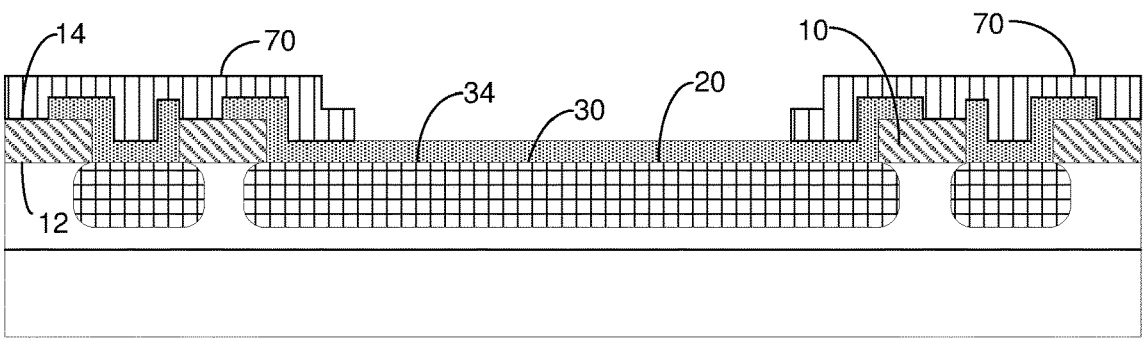
FIG. 1D  *PRIOR ART*

| 1000 | PATTERN FIELD LAYER, WHICH BLOCKS DIFFUSION OF MOBILE IONS, ON FIRST FACE OF SEMICONDUCTOR LAYER, FIELD LAYER MATERIAL MAINTAINS STRUCTURAL INTEGRETY AT PROCESSING TEMP UP TO 1200 DEG. C; OPT. BLOCK FOR AT LEAST 1 HOUR AT 450 DEG., OPT. 1000 HOURS AT 200 DEG.; OPT. RESIDUAL STRESS < 2E9 DYNES/CM2, OPT. 1E9 DYNES/CM2; OPT. RESISTANT TO POLARIZATION AND HOT CARRIER INJECTION SUCH THAT VOLTAGE BLOCKING TERMINATION DOES NOT DEGRADE AT CONDITIONS OF 1700 V FOR UP TO 1000 HOURS AT TEMP. OF 175 DEG.; OPT. REFRACTIVE INDEX OF FIELD LAYER INCREASES FROM FIRST FACE TO SECOND FACE; OPT. FIELD LAYER ONE OF SILICON OXYNITRIDE, PSG, BSG AND BPSG |
| 1010 | (OPT.) DEPOSIT AT LEAST ONE DOPED WELL IN SEMICONDUCTOR LAYER, PATTERNED FIELD LAYER ADJACENT AT LEAST A PORTION OF DOPED WELL |
| 1020 | (OPT.) ACTIVATE AT LEAST ONE DOPED WELL |
| 1030 | (OPT.) DEPOSIT SILICIDE LAYER ON SECOND FACE OF SEMICONDUCTOR LAYER, OPT. FIELD LAYER PATTERNING PERFORMED AFTER DOPED WELL DEPOSITING, WELL ACTIVATION AND SILICIDE DEPOSITING |
| 1040 | (OPT.) DEPOSIT METAL LAYER ON AT LEAST A PORTION OF FIRST FACE OF SEMICONDUCTOR LAYER, FIELD LAYER AND METAL LAYER COMPLETELY COVER DEPOSITED AT LEAST ONE WELL |
| 1050 | (OPT.) DEPOSIT LOW CONTACT RESISTANCE BACKSIDE METAL ON SECOND FACE OF SEMICONDUCTOR LAYER, OPT. FIELD LAYER PATTERNING PERFORMED AFTER DOPED WELL DEPOSITING AND WELL ACTIVATION |

FIG. 5

SEMICONDUCTOR DEVICE WITH IMPROVED FIELD LAYER

TECHNICAL FIELD

The present invention relates to the field of semiconductor devices and in particular to a semiconductor device with an improved field layer.

BACKGROUND OF THE INVENTION

Diodes are semiconductor devices characterized by the ability to block high voltage in the reverse direction with very low leakage current and carry high current in the forward direction with low forward voltage drop. They can be of two different types, either P—N or Schottky diodes. P—N diodes are made of two oppositely doped semiconductor portions, which form a P—N electrical junction. Typically, the P—N junction is formed by implanting doped wells into an oppositely doped semiconductor substrate. Schottky diodes are made of a metal region and a semiconductor region, with the difference in work-function between the two regions forming a Schottky electrical junction. Typically, the Schottky junction is formed by depositing a metal on a doped semiconductor substrate. Both types of diodes are widely used in power electronic circuits to provide the functions for freewheeling, rectification, and snubbing in converters, inverters, motor controls, switch mode power suppliers, power factor correction, inductive heating, welding, uninterruptible power supplies and many other power conversion applications.

Silicon has been and remains the material of choice to manufacture semiconductor devices. Technology improvement enabled a steady reduction of silicon devices cost over the years. However, in the field of power electronics, new materials such as silicon carbide (SiC) could compete with silicon. Recent break-throughs in SiC technology allow to take full advantage of SiC better high voltage (critical avalanche electric field) and high temperature (thermal conductivity) characteristics than silicon.

Typically, the fabrication process of high performance, high blocking voltage fast rectifying diodes require four to six photomasks for the implementation of all desired features. In the prior art, a minimum of three photomasks for silicon technology and four photomasks for SiC technology were reported. FIGS. 1A-1D illustrate steps of a prior art three photomask fabrication process of a fast recovery epitaxial diode (FRED) in silicon technology.

In a first step, illustrated in FIG. 1A, a field layer 10, typically consisting of silicon dioxide, is grown on a semiconductor layer 20 and a first photomask (not shown) is used to etch field layer 10. The term 'field layer', as used herein, and as known to those skilled in the art at the time of the invention, means a patterned layer which protects a high voltage termination of a semiconductor device. Windows 15 are etched in field layer 10. In one embodiment, semiconductor layer 20 consists of an n-doped semiconductor. Particularly, in one further embodiment, semiconductor layer comprises: an epitaxial layer 30 exhibiting a first face 32 and a second face 34, second face 34 opposing first face 32; and a doped substrate 40 exhibiting a first face 42 and a second face 44, second face 44 opposing first face 42. First face 32 of epitaxial layer 30 is deposited on first face 42 of doped substrate 40 and field layer 10 is grown on second face 34 of epitaxial layer 30. Additionally, field layer 10 exhibits a first face 12 and a second face 14, second face 14 opposing first face 12. First face 12 of field layer 10 faces second face 34 of epitaxial layer 30.

In a second step, illustrated in FIG. 1B, dopant ions are implanted into epitaxial layer 30, through windows 15, and diffused into the desired depth, to form doped wells 50. The doping of doped wells 50 is the opposite of the doping of semiconductor layer 20. Particularly, in the event that semiconductor layer 20 is doped with an n-type dopant, doped wells 50 are formed with a p-type dopant, and vice versa. The diffusion and activation of doped wells 50 are performed at high temperatures, up to 1200° C. for silicon technology. The doping level and depth of doped wells 50 are varied dependent upon the desired blocking voltage and the particular voltage blocking scheme.

In a third step, illustrated in FIG. 1C, a metal layer 60 is deposited onto second face 34 of epitaxial layer 30. Particularly, metal layer 60 fills in windows 15 to cover doped wells 50 and additionally covers a portion of second face 14 of field layer 10. A second photomask (not shown) is used to etch metal layer 60 to expose portions of field layer 10.

In a fourth step, illustrated in FIG. 1D, a passivation layer 70 is deposited over field layer 10. A third photomask (not shown) is used to etch passivation layer 70 to expose a portion of metal layer 60. In one embodiment, passivation layer 70 consists of silicon oxynitride. Passivation layer 70 is used due to the fact that the silicon dioxide of field layer 10 does not block the diffusion of mobile ions. Particularly, mobile ions, such as sodium and potassium, accumulate on second face 14 of field layer 10. The mobile ions diffuse into field layer 10 and travel to the junction between first face 12 of field layer 10 and second face 34 of epitaxial layer 34, where they attract electrons from semiconductor layer 20. The blocking voltage of the diode thereby changes due to voltages and currents generated at second face 34 of epitaxial layer 30 by the diffused mobile ions. In diodes with a high blocking voltage, which exhibit low doping concentrations of semiconductor layer 20, the effects are very significant since even low amounts of mobile ions will have a significant effect on the charges in the low doped semiconductor layer 20. The diffusion of the mobile ions into field layer 10 increases responsive to the electric field generated when a voltage is present across the diode. Additionally, the diffusion of the mobile ions into field layer 10 increases exponentially responsive to an increase in temperature. Specifically, the diffusivity of field layer 10, denoted D, is given as:

$$D = D_0 * e^{-E_A/(kT)} \qquad \text{EQ. 1}$$

where $D_0$ is the maximal diffusion coefficient, $E_A$ is the diffusion activation energy, k is the Boltzmann constant and T is the absolute temperature. As shown in EQ. 1, the diffusion coefficient is an exponential function of the temperature.

Passivation layer 70 consists of material which effectively blocks the mobile ions from reaching field layer 10, thereby preventing any diffusion of those mobile ions into field layer 10. Unfortunately, depositing and etching passivation layer 70 requires an additional photomask, which adds cost and complexity to the fabrication process. Although the above has been described in relation to the fabrication process of a FRED, the additional photomask for a passivation layer is needed in other types of diodes, such as an SiC Schottky barrier diode (SBD), as will be described below.

A SiC SBD fabrication process requires one additional photomask compared to a silicon FRED process. The activation of the doped wells in SiC is performed at temperatures up to 1700° C. At such temperature, no known field layer material would keep its structural integrity. Therefore, the field layer patterning and dopant implantation cannot share the same photomask and each step should have a dedicated photomask. The dopant implantation is performed first. A subsequent clean up provides a bare SiC surface to move to the dopant activation step. Once the dopant activation is completed, the field layer can be deposited and patterned.

What is desired, and not provided by the prior art, is a method of fabricating a semiconductor device without the need of additional photomask for a passivation layer.

SUMMARY OF THE INVENTION

Accordingly, it is a principal object of the present invention to overcome at least some of the disadvantages of the prior art. This is provided in one embodiment by a semiconductor device comprising: a semiconductor layer; and a field layer patterned on the semiconductor layer, the field layer constituted of a material which blocks the diffusion of mobile ions to the semiconductor layer and which maintains its structural integrity at the elevated temperatures of semiconductor devices fabrication and assembly. Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawing:

FIGS. 1A-1D illustrate steps of a prior art three photomask fabrication process of a fast recovery epitaxial diode (FRED);

FIG. 5 illustrates a high level flow chart of a fabrication process of a semiconductor device, in accordance with certain embodiments.

DETAILED DESCRIPTION OF PREFERRED EMBODIMENTS

Figure 2:
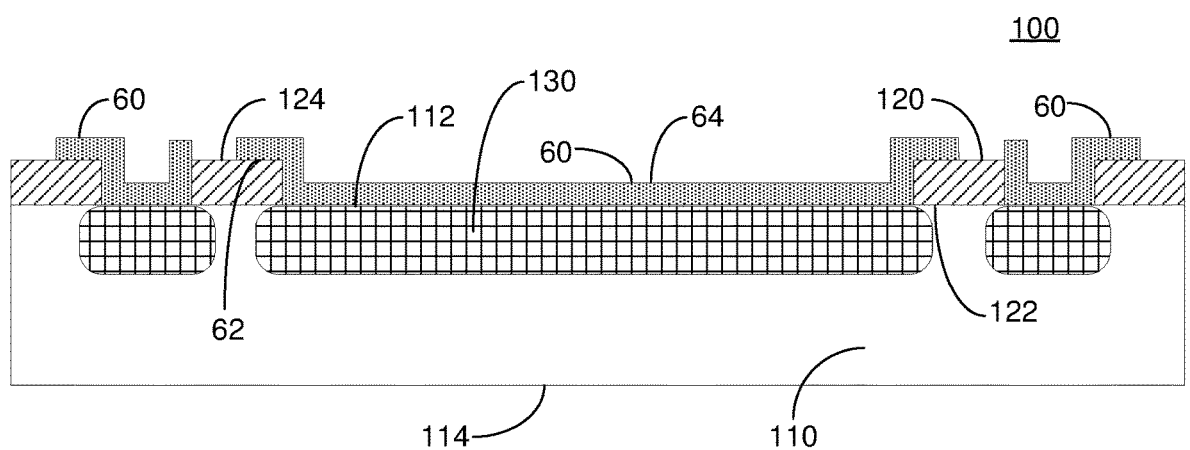
FIG. 2 illustrates a semiconductor device with an improved field layer, in accordance with certain embodiments.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 2 illustrates a semiconductor device 100, semiconductor device 100 comprising: a semiconductor layer 110 exhibiting a first face 112 and a second face 114 opposing first face 112; a field layer 120 exhibiting a first face 122 and a second face 124 opposing first face 122; and a metal layer 60 exhibiting a first face 62 and a second face 64 opposing first face 62. In one embodiment, semiconductor device 100 is a diode. In one further embodiment, semiconductor device 100 is a high voltage diode. Semiconductor layer 110 is constituted of a doped material. In one non-limiting embodiment, semiconductor layer 110 comprises one of: SiC; silicon; and gallium arsenide (GaAs). Semiconductor layer 110 includes at least one doped well 130. In one embodiment, semiconductor layer 110 includes a plurality of doped wells 130. Each doped well 130 is doped with a dopant which is of the opposing type of the dopant of semiconductor layer 110, such that one or more p-n junctions are formed.

Field layer 120 is constituted of a material having characteristics which effectively block diffusion of mobile ions, i.e. the diffusion coefficient of the material is such that mobile ions will not pass through field layer 120 and reach first face 112 of semiconductor layer 110. In one particular embodiment, the material of field layer 120 has characteristics which effectively block the diffusion of sodium and potassium. In another embodiment, the material of field layer 120 has characteristics which effectively block the diffusion of all mobile ions. In one embodiment, the material of field layer 120 has characteristics which effectively blocks the diffusion of mobile ions for at least 1 hour at a temperature of 450 degrees centigrade. In another embodiment, the material of field layer 120 has characteristics which effectively blocks the diffusion of mobile ions for at least 1000 hours at a temperature of 200 degrees centigrade. In one embodiment, the material of field layer 120 has characteristics which are sufficiently resistance to polarization and hot carrier injection such that the performance of voltage blocking termination structures does not degrade over reverse bias voltages of up to 1,700 Volts for up to 1,000 hours, at temperatures of up to 175° C.

In one embodiment, the thickness of field layer 120, i.e. the distance between first face 122 and second face 124, is 0.5-5 micrometers. In one further embodiment, the thickness of field layer 120 is 2-4 micrometers. In another embodiment, the material of field layer 120 has characteristics which effectively block moisture in typical environmental conditions, measured in one embodiment in an 85/85 test.

In one embodiment, the refractive index of field layer 120 is about 1.55-1.60. Particularly, the refractive index provides a measurement of the stoichiometry of field layer 120. A lower refractive index provides increased stability of field layer 110 at high temperatures which allows field layer 120 to maintain structural integrity at activation and assembly temperatures of up to 1,200° C. and 800° C., respectively. In another embodiment, the stoichiometry of field layer 120 is such that field layer 120 exhibits a graded refractive index. In one further embodiment, the refractive index of field layer 120 increases from first face 122 to second face 124, i.e. the refractive index of field layer 120 at second face 124 is greater than the refractive index at first face 122. Particularly, and without being bound by theory, the inventors have discovered that high temperature induced structural deformations in field layers propagate from the interface between the field layer and the semiconductor layer due to the difference in the stoichiometry of the field layer and the semiconductor layer. Therefore, adjusting the stoichiometry of field layer 120 to exhibit a lower refractive index near the semiconductor layer, which is closer to the refractive index of $SiO_2$, while exhibiting a higher refractive index at the opposing side thereof, which decreases the diffusivity of field layer 120, provides a field layer 120 which effectively blocks mobile ions and additionally maintains structural integrity at high temperatures. Specifically, in one embodiment, the material of field layer 120 has characteristics which maintain structural integrity at temperatures of up to 800° C. during the assembly process. In one further embodiment, the material of field layer 120 has characteristics which maintain structural integrity at temperatures of up to 1200° C. during the fabrication process.

In one non-limiting embodiment, field layer 120 is constituted of silicon oxynitride ($SiO_XN_Y$). As known to those skilled in the art at the time of the invention, the amorphous structure of $SiO_XN_Y$ allows for a wide range of stoichiometry values, from silicon dioxide ($SiO_2$), where y=0 to silicon nitride ($Si_3N_4$), where x=0. It is well known that the diffusivity of mobile ions is very high in $SiO_2$ and very low in $Si_3N_4$, and that the diffusivity decreases monotonically with increased N concentration, and increases monotonically with increased O concentration, in $SiO_XN_Y$ films. In one embodiment, the $SiO_XN_Y$ of field layer 120 has a stoichiometry such that the refractive index at first face 122 is about 1.55 and the refractive index at second face 124 is no more than 1.84. In one further embodiment, the refractive index at second face 124 is about 1.71. In another embodiment, the refractive index at first face 122 is in the range of 1.47-1.49, preferably about 1.48, and the refractive index at second face 124 is between 1.71-1.72. The refractive index increases as the nitrogen content is increased and decreases as the oxygen content is increased. All references to specific refractive indexes in this document are determined with an ellipsometer having a 633 nm light source, it being understood that the specific values are a function of the light source utilized for measurement.

It is well known that mobile ion diffusion in boron and/or phosphorous doped glasses is significantly reduced by the incorporation of boron and/or phosphorous in the glass matrix. In one embodiment, field layer 120 is constituted of phosphosilicate glass (PSG). In one further embodiment, the PSG exhibits 3%-10% phosphorous within a silicon dioxide matrix. In another embodiment, field layer 120 is constituted of borosilicate glass (BSG). In one further embodiment, the BSG exhibits 3%-10% boric oxide within a silicon dioxide matrix. In one embodiment, field layer 120 is constituted of borophosphosilicate glass (BPSG). In one further embodiment, the BPSG exhibits 3%-10% boric oxide and 3%-10% phosphorous within a silicon dioxide matrix.

First face 122 of field layer 120 faces first face 112 of semiconductor layer 110, and is patterned thereon, such that field layer 120 is adjacent at least a portion of the at least one doped well 130. Specifically, field layer 120 covers at least a portion of the at least one doped well 130. As will be described further below, field layer 120 is in one embodiment divided into a plurality of sections, each section of field layer 120 covering a respective portion of the at least one doped well 130. In one embodiment, the patterning process is performed such that after field layer 120 is patterned on first face 112 of semiconductor layer 110, field layer 120 exhibits residual film stress, i.e. permanent stress induced by the patterning process, of less than 2 giga-dynes per centimeter squared. Preferably, field layer 120 exhibits residual film stress of less than 1 giga-dyne per centimeter squared.

First face 62 of metal layer 60 is deposited on at least a portion of first face 112 of semiconductor layer 110. Particularly, field layer 120 and metal layer 60 together cover the at least one doped well 130. In one embodiment, field layer 120 and metal layer 60 together cover the entirety of first face 112 of semiconductor layer 110. In another embodiment, first face 62 of metal layer 60 further covers at least a portion of second face 122 of field layer 120. In the embodiment where field layer 120 is etched into several sections, first face 62 of metal layer 60 covers a portion of second face 122 of each part of field layer 120. In one further embodiment, metal layer 60 is similarly divided into a plurality of sections.

As illustrated, a passivation layer is not juxtaposed with field layer 120. Particularly, since field layer 120 blocks mobile ions, no passivation layer is needed.

Figure 3A:
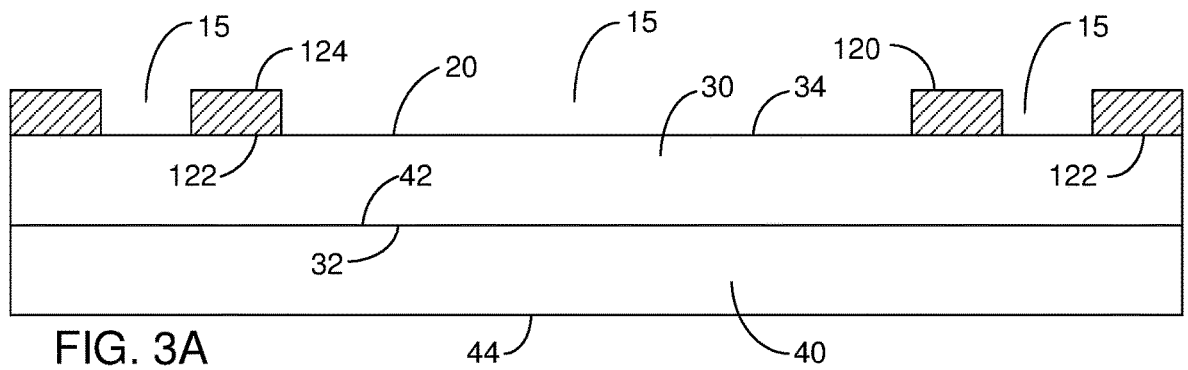
FIGS. 3A-3C illustrate steps of an embodiment of a two photomask fabrication process of a FRED.
Figure 3B:
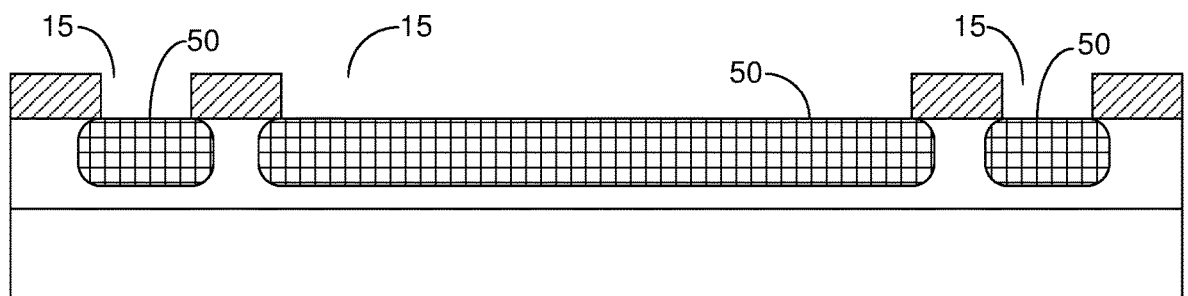
Figure 3C:
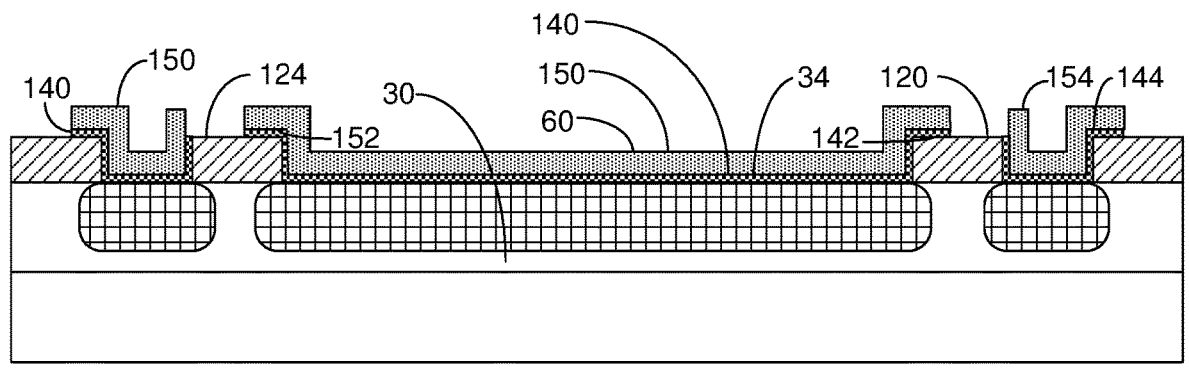

FIGS. 3A-3C illustrate steps of an embodiment of a two photomask fabrication process of a FRED. In a first step, illustrated in FIG. 3A, a field layer 120 is deposited on a semiconductor layer 20 and a first photomask (not shown) is used to etch field layer 120. In one non-limiting embodiment, field layer 120 is constituted of silicon oxynitride. In one further non-limiting embodiment the silicon oxynitride is deposited with a plasma enhanced chemical vapor deposition process, utilizing the Applied Precision 5000 tool, commercially available from Applied Materials of Santa Clara, Calif. In such an embodiment, and in order to achieve a refractive index of 1.55, the following materials were applied at a pressure of 4.2 Torr and at a power of 540 W: silane ($SIH_4$), at a flow rate of 180 sccm; ammonia ($NH_3$), at a flow rate of 35 sccm; nitrous oxide ($N_2O$), at a flow rate of 370 sccm; and nitrogen ($N_2$), at a flow rate of 4000 sccm. In order to achieve a refractive index of 1.718, the following materials were applied at a pressure of 4.2 Torr and at a power of 540 W: $SIH_4$, at a flow rate of 275 sccm; $NH_3$, at a flow rate of 35 sccm; $N_2O$, at a flow rate of 180 sccm; and $N_2$, at a flow rate of 4000 sccm.

In one embodiment, the patterning process is performed such that after field layer 120 is deposited on semiconductor layer 20, field layer 120 exhibits residual film stress of less than 2 giga-dynes per centimeter squared. Preferably, field layer 120 exhibits residual film stress of less than 1 giga-dyne per centimeter squared.

Windows 15 are etched in field layer 120. Semiconductor layer 20 comprises: an epitaxial layer 30 exhibiting a first face 32 and a second face 34, second face 34 opposing first face 32; and a doped substrate 40 exhibiting a first face 42 and a second face 44, second face 44 opposing first face 42. First face 32 of epitaxial layer 30 is deposited on first face 42 of doped substrate 40 and field layer 120 is grown on second face 34 of epitaxial layer 30. Additionally, field layer 120 exhibits a first face 122 and a second face 124, second face 124 opposing first face 122. First face 122 of field layer 120 is grown on second face 34 of epitaxial layer 30.

In a second step, illustrated in FIG. 3B, dopant ions are implanted into epitaxial layer 30, through windows 15, and diffused into the desired depth, to form doped wells 50. The doping of doped wells 50 is the opposite of the doping of semiconductor layer. Particularly, in the event that semiconductor layer 20 is doped with an n-type dopant, doped wells 50 are formed with a p-type dopant, and vice versa. The doping level and depth of doped wells 50 are varied dependent upon the desired blocking voltage and the particular voltage blocking scheme. Doped wells 50 are activated by annealing epitaxial layer 30 at a high temperature, optionally up to 1200° C.

In a third step, illustrated in FIG. 3C, a metal layer 60 is deposited onto second face 34 of epitaxial layer 30 and a second photomask (not shown) is used to etch the deposited metal layer 60 to expose portions of field layer 120. Particularly, metal layer 60 fills in windows 15 to cover doped wells 50 and additionally covers a portion of each of the sections of field layer 120. In one embodiment, metal layer 60 comprises: a titanium layer 140 exhibiting a first face 142 and a second face 144 opposing first face 142; and an aluminum layer 150 exhibiting a first face 152 and a second face 154 opposing first face 152. Particularly, first face 142 of titanium layer 140 is deposited onto second face 34 of epitaxial layer 30 and first face 152 of aluminum layer 150 is deposited onto second face 144 of titanium layer 140. Second face 154 of aluminum layer 150 remains exposed and no passivation layer is deposited onto aluminum layer 150 and field layer 120, as described above.

FIGS. 4A-4H illustrate steps of an embodiment of a three photomasks fabrication process of an SiC SBD. In a first step, illustrated in FIG. 4A, an oxide layer 200 is deposited on a first face 212 of an SiC wafer 210 and a first photomask (not shown) is used to etch windows 15 into oxide layer 200.

Figure 4A:
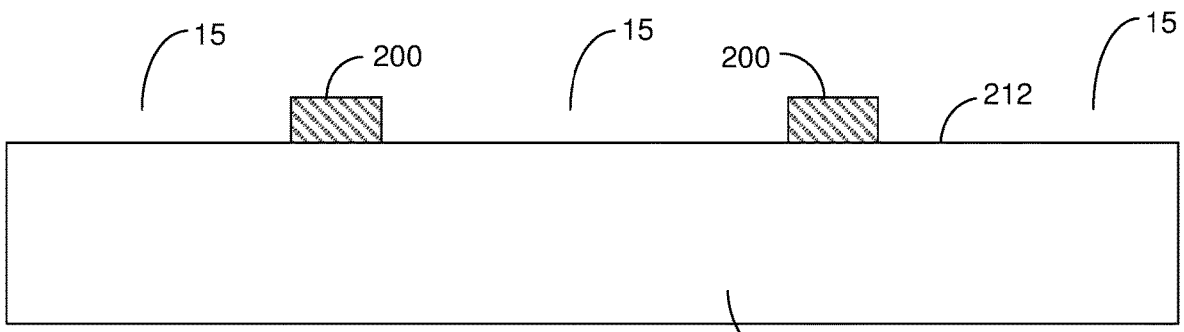
FIGS. 4A-4H illustrates steps of an embodiment of a three photomask fabrication process of a SiC Schottky barrier diode (SBD)
Figure 4B:
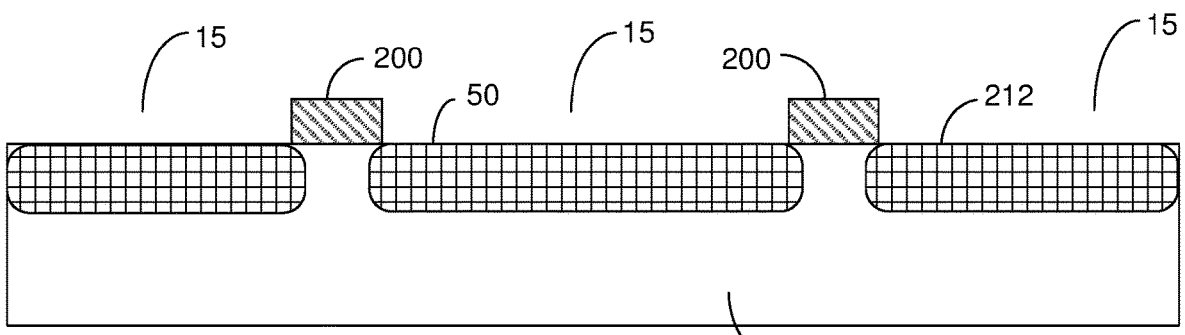
Figure 4C:
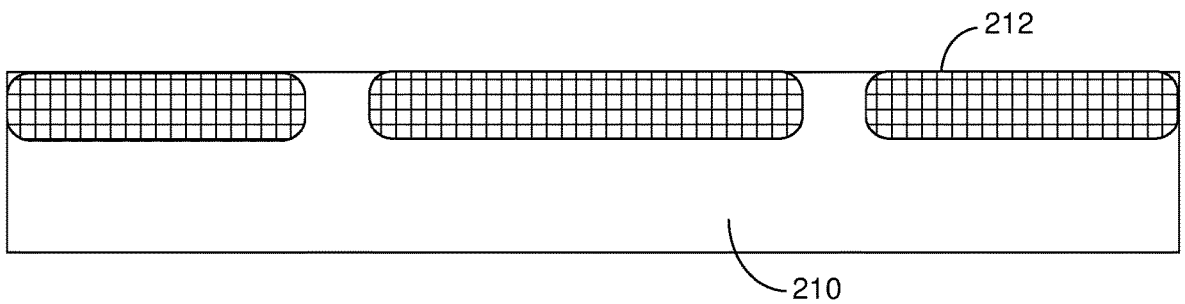

In a second step, illustrated in FIG. 4B, dopant ions are implanted into SiC wafer 210, through windows 15, to form doped wells 50. The doping of doped wells 50 is the opposite of the doping of semiconductor layer. Particularly, in the event that SiC wafer 210 is doped with an n-type dopant, doped wells 50 are formed with a p-type dopant, and vice versa. The doping level and depth of doped wells 50 are varied dependent upon the desired blocking voltage and the particular voltage blocking scheme. In a third step, illustrated in FIG. 4C, etched oxide layer 200 is removed and doped wells 50 are activated by annealing SiC wafer 210 at a high temperature, optionally up to 1,700° C. Prior to the well activation a carbon layer (not shown) is deposited on first face 212 of SiC wafer 210.

Figure 4D:
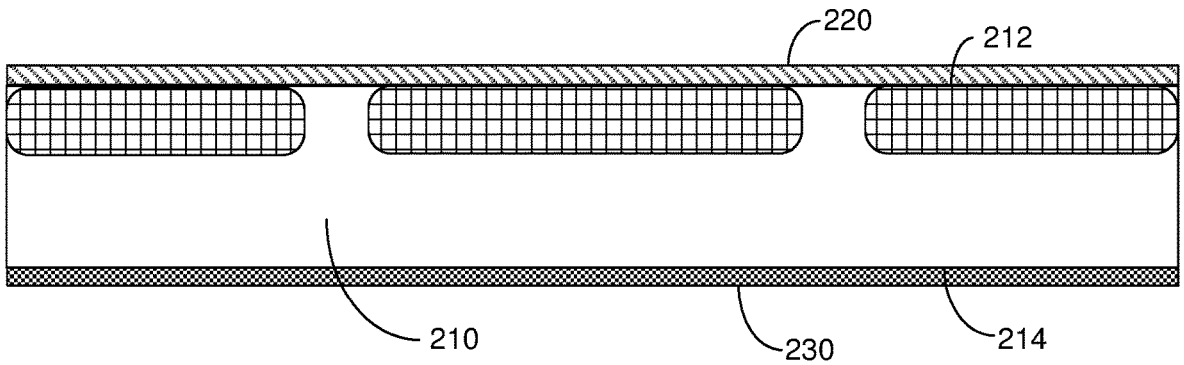

In a fourth step, illustrated in FIG. 4D, an oxide layer 220 is deposited on first face 212 of SiC wafer 210 and a nickel layer 230 is deposited on a second face 214 of SiC wafer 210, second face 214 opposing first face 212. Nickle layer 230 is annealed at a high temperature, optionally up to 1,000° C., to form a nickel silicide layer 240.

Figure 4E:
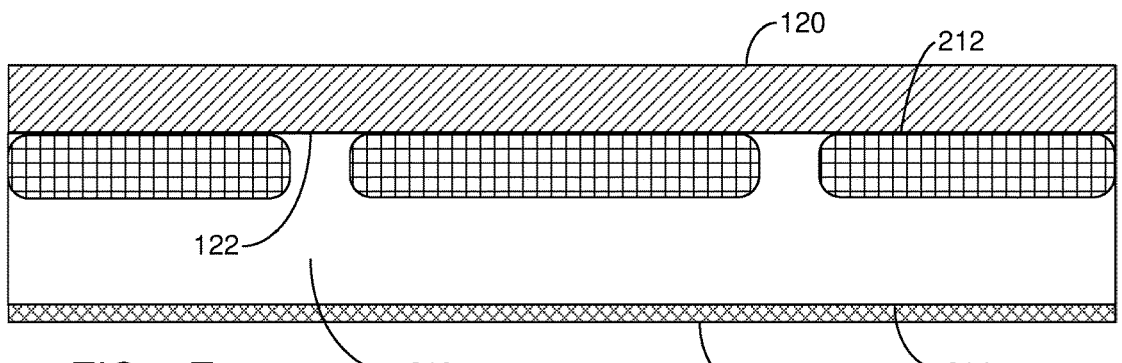
Figure 4F:
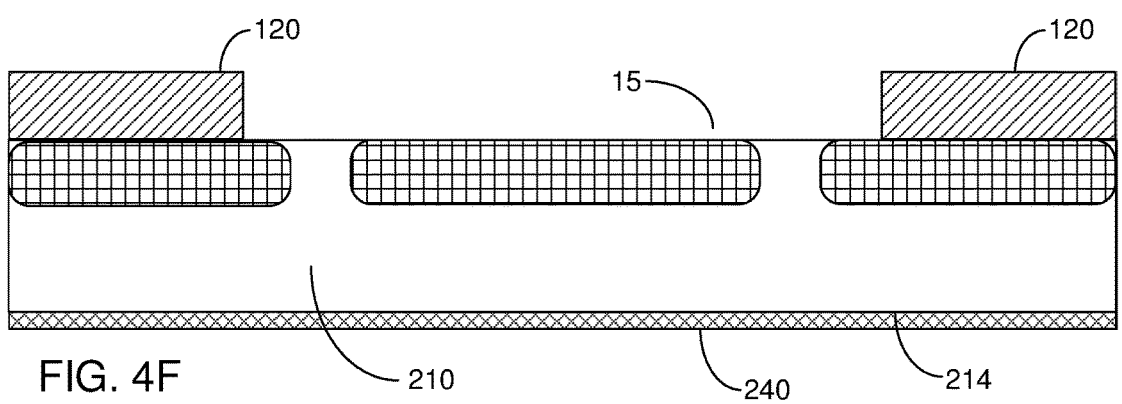

In a fifth step, illustrated in FIG. 4E, oxide layer 220 is removed and a field layer 120 is deposited on first face 212 of SiC wafer 210 such that a first face 122 of field layer 120 faces first face 212 of SiC wafer 210. As described above, in one non-limiting embodiment field layer 120 is composed of silicon oxynitride. In a sixth step, illustrated in FIG. 4F, a second photomask (not shown) is used to etch a window 15 into field layer 120. Depositing field layer 120 only after the activation of doped wells 50 and the formation of nickel silicide layer 240 allows for use of a field layer 120 which does not need to withstand the high annealing temperatures of the well activation and silicide formation. In one embodiment, the patterning process is performed such that after field layer 120 is deposited on semiconductor layer 210, field layer 120 exhibits residual film stress of less than 2 giga-dynes per centimeter squared. Preferably, field layer 120 exhibits residual film stress of less than 1 giga-dyne per centimeter squared.

Figure 4G:
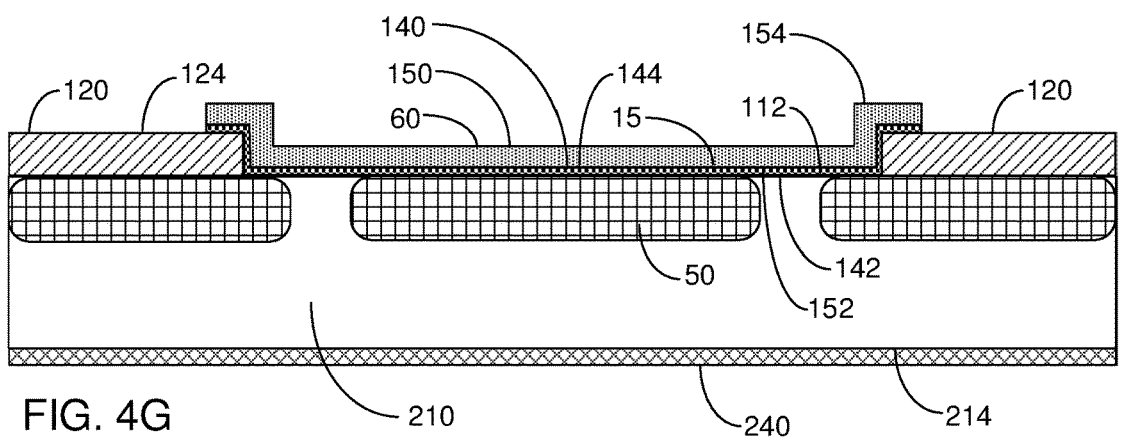

In a seventh step, illustrated in FIG. 4G, a metal layer 60 is deposited on a second face 124 of field layer 120, second face 124 opposing first face 122 thereof. Particularly, metal layer 60 fills in window 15 to cover doped wells 50 and additionally covers etched field layer 120. Additionally, a third photomask (not shown) is used to etch metal layer 60 to expose portions of etched field layer 120. In one embodiment, metal layer 60 comprises: a titanium layer 140 exhibiting a first face 142 and a second face 144 opposing first face 142; and an aluminum layer 150 exhibiting a first face 152 and a second face 154 opposing first face 152. Specifically, first face 142 of titanium layer 140 is deposited onto first face 212 of SiC wafer 210 and first face 152 of aluminum layer 150 is deposited onto second face 144 of titanium layer 140. Second face 154 of aluminum layer 150 remains exposed and no passivation layer is deposited onto aluminum layer 150 and field layer 120, as described above.

Figure 4H:
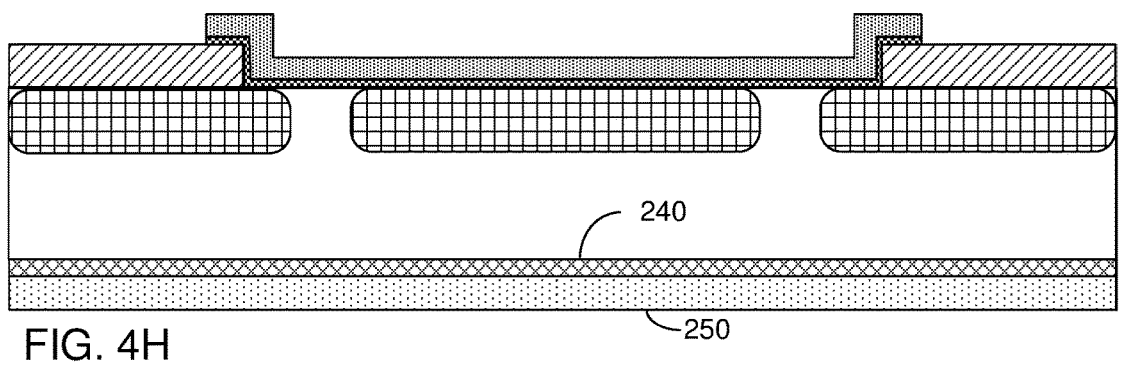

In an eighth step, illustrated in FIG. 4H, a metal layer 250 is deposited on nickel silicide layer 240. In one embodiment, prior to depositing metal layer 250, an oxide layer (not shown) is deposited on nickel silicide layer 240, annealed at a temperature of about 450° C. and removed.

FIG. 5 illustrates a high level flow chart of a semiconductor device fabrication method, in accordance with certain embodiments. In stage 1000, a field layer is patterned on a first face of a semiconductor layer. The field layer is constituted of material having characteristics which block diffusion of mobile ions, and which maintains structural integrity at processing temperatures up to 1200° C. In one embodiment, the field layer material characteristics block the diffusion of mobile ions for at least 1 hour at a temperature of 450 degrees centigrade. In another embodiment, the field layer material characteristics block the diffusion of mobile ions for at least 1000 hours at a temperature of 200 degrees centigrade. In one embodiment, the patterned field layer exhibits residual film stress of less than 2 giga-dynes per centimeter squared. In one further embodiment, the patterned field layer exhibits residual film stress of less than 1 giga-dyne per centimeter squared. In another embodiment, the material of the field layer has characteristics which are sufficiently resistant to polarization and hot carrier injection such that the performance of voltage blocking termination structures does not degrade over reverse bias voltages of up to 1,700 Volts for up to 1,000 hours, at temperatures of up to 175° C.

In one embodiment, the field layer exhibits a first face and a second face opposing the first face thereof, the field layer being patterned such that the first face thereof faces the first face of the semiconductor layer. Additionally, the refractive index of the field layer increases from the first face to the second face thereof, i.e. the refractive index of the field layer at the second face thereof is greater than the refractive index of the field layer at the first face thereof.

In one embodiment, the material characteristics of the field layer block moisture. In another embodiment, the material of the patterned layer is selected from the group consisting of: silicon oxynitride; phosphosilicate glass; borosilicate glass; and borophosphosilicate glass.

In optional stage 1010, at least one doped well is formed within the semiconductor layer. The patterning of stage 1000 is arranged such that the patterned field layer is adjacent at least a portion of at least one doped well. In optional stage 1020, the at least one doped well of optional stage 1010 is activated. In one embodiment, the doped well activation is performed by annealing the semiconductor layer of stage 1000 at a high temperature. In optional stage 1030, a silicide layer is formed on a second face of the semiconductor layer of stage 1000. The second face of the semiconductor layer opposes the first face thereof. In one embodiment, the patterning of stage 1000 is performed after: the implantation of the at least one doped wells of stage optional stage 1010;

the activation of the at least one doped wells of optional stage 1020; and the formation of the silicide layer. Particularly, the steps of optional stages 1010-1030 are all high temperature processes, and the field layer material characteristics maintain structural integrity at the processing temperatures of up to 1200° C. Patterning the field layer after the high temperature processes are completed prevents cracking of the field layer. In optional stage 1040, a metal layer is deposited on at least a portion of the first face of the semiconductor layer of stage 1000. The patterned field layer and the deposited metal layer completely cover the at least one doped well of optional stage 1010. In optional stage 1050, a low contact resistance backside metal is deposited on the second face of the semiconductor layer of stage 1000

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

The invention claimed is:

1. A semiconductor device comprising:
   a semiconductor layer having at least one doped well formed therein; and
   a field layer patterned on said semiconductor layer, said field layer adjacent at least a portion of said at least one doped well, said field layer constituted of material having characteristics that:
      block diffusion of mobile ions; and
      maintain structural integrity at processing temperatures of up to 1200 degrees centigrade.

2. The semiconductor device of claim 1, further comprising a metal layer deposited on at least a portion of said semiconductor layer, said field layer and said metal layer completely covering said at least one doped well.

3. The semiconductor device of claim 1, wherein said patterned field layer material characteristics block said diffusion of mobile ions for at least 1 hour at a temperature of 450 degrees centigrade.

4. The semiconductor device of claim 1, wherein said patterned field layer material characteristics block said diffusion of mobile ions for at least 1000 hours at a temperature of 200 degrees centigrade.

5. The semiconductor device of claim 1, wherein said patterned field layer exhibits residual film stress of less than 1 giga-dyne per centimeter squared.

6. The semiconductor device of claim 1, wherein said material is selected from the group consisting of: silicon oxynitride; phosphosilicate glass; borosilicate glass; and borophosphosilicate glass.

7. A semiconductor device comprising:
   a semiconductor layer; and
   a field layer patterned on said semiconductor layer, said field layer constituted of material having characteristics that:
      exhibit residual film stress of less than 2 giga-dynes per centimeter squared;
      block diffusion of mobile ions; and
      maintain structural integrity at processing temperatures of up to 1200 degrees centigrade.

8. A semiconductor device comprising:
   a semiconductor layer; and
   a field layer patterned on said semiconductor layer, said field layer constituted of material having characteristics that:
      exhibit a refractive index of 1.55-1.60 as determined by an ellipsometer with a 633 nm light source;
      block diffusion of mobile ions; and
      maintain structural integrity at processing temperatures of up to 1200 degrees centigrade.

9. A semiconductor device comprising:
   a semiconductor layer; and
   a field layer patterned on said semiconductor layer, said field layer having a first face and a second face opposing said first face, said field layer patterned on said semiconductor layer at said first face, and wherein the refractive index of said patterned field layer increases from said first face to said second face, said field layer constituted of material having characteristics that:
      block diffusion of mobile ions and
      maintain structural integrity at processing temperatures of up to 1200 degrees centigrade.

10. The semiconductor device of claim 9, wherein said patterned field layer exhibits a refractive index of 1.47-1.49 at said first face, said refractive index at said first face determined by an ellipsometer with a 633 nm light source.

11. The semiconductor device of claim 10, wherein said patterned field layer exhibits a refractive index of 1.71-1.72 at said second face, said refractive index at said second face determined by the ellipsometer with the 633 nm light source.

12. A semiconductor device fabrication method, the method comprising:
   patterning a field layer on a first face of a semiconductor layer, the field layer constituted of material having characteristics which block diffusion of mobile ions;
   depositing at least one doped well in the semiconductor layer; and activating said at least one doped well,
   wherein said field layer material characteristics maintain structural integrity at processing temperatures of up to 1200 degrees centigrade.

13. The method of claim 12
   wherein said patterned field layer is adjacent at least a portion of said at least one doped well, said method further comprising:
   depositing a metal layer on at least a portion of the first face of the semiconductor layer, said patterned field layer and said deposited metal layer completely covering said at least one doped well; and depositing a low contact resistance metal on a second face of the semiconductor layer, the second face opposing the first face thereof, wherein said patterning of the field layer is performed after said at least one doped well activation.

14. The method of claim 12, wherein said patterned field layer is adjacent at least a portion of said at least one doped well, said method further comprising:

forming a silicide layer on a second face of the semiconductor layer, the second face opposing the first face thereof; and depositing a metal layer on at least a portion of the first face of the semiconductor layer, said patterned field layer and said deposited metal layer completely covering said at least one doped well, wherein said patterning of the field layer is performed after said at least one doped well activation and said formation of the silicide layer.

15. The method of claim 12, wherein said patterned field layer material characteristics block said diffusion of mobile ions for at least 1 hour at a temperature of 450 degrees centigrade.

16. The method of claim 12, wherein said patterned field layer material characteristics block said diffusion of mobile ions for at least 1000 hours at a temperature of 200 degrees centigrade.

17. The method of claim 12, wherein said patterned field layer exhibits residual film stress of less than 2 giga-dynes per centimeter squared.

18. The method of claim 12, wherein said patterned field layer exhibits residual film stress of less than 1 giga-dyne per centimeter squared.

19. The method claim 12, wherein said patterned field layer exhibits a refractive index of 1.55-1.60 as determined by an ellipsometer with a 633 nm light source.

20. The method of claim 12, wherein said patterned field layer exhibits a first face and a second face, opposing the first face thereof, the first face of the field layer patterned on the first face of the semiconductor layer, and wherein the refractive index of said patterned field layer increases from the first face of the field layer to the second face thereof.

21. The method of claim 20, wherein said patterned field layer exhibits a refractive index of 1.47-1.49 at said first face, said refractive index at said first face determined by an ellipsometer with a 633 nm light source.

22. The method of claim 21, wherein said patterned field layer exhibits a refractive index of 1.71-1.72 at said second face, said refractive index at said second face determined by the ellipsometer with the 633 nm light source.

23. The method of claim 12, wherein the material is selected from the group consisting of: silicon oxynitride; phosphosilicate glass; borosilicate glass; and borophosphosilicate glass.

* * * * *